(12) United States Patent
Katagami et al.

(10) Patent No.: US 6,774,362 B2
(45) Date of Patent: Aug. 10, 2004

(54) ANALYTICAL METHOD FOR ELECTRON MICROSCOPY

(75) Inventors: Masumi Katagami, Tokyo (JP); Miyuki Kaneyama, Tokyo (JP)

(73) Assignees: JEOL Ltd., Tokyo (JP); JEOL Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/259,216

(22) Filed: Sep. 27, 2002

(65) Prior Publication Data

US 2003/0089851 A1 May 15, 2003

(30) Foreign Application Priority Data

Sep. 27, 2001 (JP) ........................................ 2001-296065

(51) Int. Cl.[7] .............................................. H01J 37/56
(52) U.S. Cl. ........................ 250/307; 250/310; 250/311
(58) Field of Search ................................ 250/306–307, 250/310, 311

(56) References Cited

U.S. PATENT DOCUMENTS 6,072,178 A * 6/2000 Mizuno ...................... 250/310
6,448,555 B1 * 9/2002 Hosokawa .................. 250/310
2001/0022346 A1 * 9/2001 Katagami et al. ........... 250/310
2001/0045515 A1 * 11/2001 Sato et al. ................... 250/311

FOREIGN PATENT DOCUMENTS

| JP | 61109253 | 5/1986 |
|----|----------|--------|
| JP | 03167460 | 7/1991 |

* cited by examiner

Primary Examiner—Mikita Wells
Assistant Examiner—Christopher M. Kalivoda
(74) Attorney, Agent, or Firm—Webb Ziesenheim Logsdon Orkin & Hanson, P.C.

(57) ABSTRACT

There is disclosed an analytical method capable of performing an analysis in electron microscopy by directing an electron beam at set analysis points wherein a reference image is displayed on a monitor and a user selects plural analysis points within the image. The specimen stage is returned to the approximate position where the reference image was obtained and a new image is obtained. At this time, the newly obtained image does not completely agree in position with the reference image due to accuracy of movement of the stage. The two images are supplied to a deviation amount calculator, which, in turn, compares the images and finds the amount of deviation of the newly obtained image from the reference image.

8 Claims, 4 Drawing Sheets

ANALYTICAL METHOD FOR ELECTRON MICROSCOPY

BACKGROUND OF THE INVENTION

1. Field of the Invention

The present invention relates to an analytical method for use in electron microscopy and, more particularly, to an analytical method of making an X-ray analysis of a specimen using a scanning transmission electron microscope or scanning electron microscope.

2. Description of Related Art

A scanning transmission electron microscope having analytical capabilities is designed to make X-ray analyses of certain points on a specimen, as well as to image the specimen in a normal manner. In this analytical mode, the specimen position and the magnification are so controlled that a point within a secondary electron image to be analyzed comes within the observed region. Then, a sharply focused beam is directed at the point to be analyzed.

As the specimen is irradiated with the electron beam in this way, characteristic X-rays are produced. The X-rays are detected by an energy-dispersive X-ray detector, for example. Where there are plural analysis points, the specimen stage and the magnification are controlled in such a way that X-ray analyses of the analysis points are carried out while controlling the specimen stage and magnification to bring each analysis point to within the observed region.

Where settings are made on previously obtained images and plural analysis points are analyzed in succession in the analytical mode, the specimen stage is controlled during the analysis sequence. However, the positional accuracy of the stage is not always sufficiently high and so it is difficult to reproduce the analysis points accurately. As a result, the electron beam may be directed at positions deviating from the set analysis points.

SUMMARY OF THE INVENTION

In view of the foregoing, the present invention has been made. It is an object of the present invention to provide an analytical method which is for use in electron microscopy and capable of precisely directing an electron beam at set analysis points and performing analyses.

This object is achieved by an analytical method comprising the steps of: obtaining a first image of a specimen as a reference image when the specimen is in a first position; storing the reference image and the first position of the specimen in memory; specifying an analysis point within the reference image; storing the coordinates of the specified analysis point in memory; returning the specimen into a second position according to the stored position of the specimen; obtaining a second image in the second position; comparing the second image with the reference image and calculating the amount of deviation in position between both images; and correcting the amount of deflection of the electron beam based on the calculated amount of deviation between the images and shining the beam at the analysis point to thereby perform an analysis of the analysis point.

The present invention also provides an analytical method comprising the steps of: obtaining plural first images of a specimen; synthesizing the first images into a synthesized image; setting an analysis point in the synthesized image; extracting an area of a given magnification including the analysis point to create a reference image; obtaining a second image of the area including the analysis point at the given magnification; comparing the second image with the reference image and calculating the amount of deviation in position between both images; and correcting the amount of deflection of the electron beam based on the calculated amount of deviation between the images and shining the beam at the analysis point to thereby perform an analysis of the analysis point on the specimen.

Other objects and features of the present invention will appear in the course of the description thereof, which follows.

DESCRIPTION OF THE PREFERRED EMBODIMENTS

Figure 1:
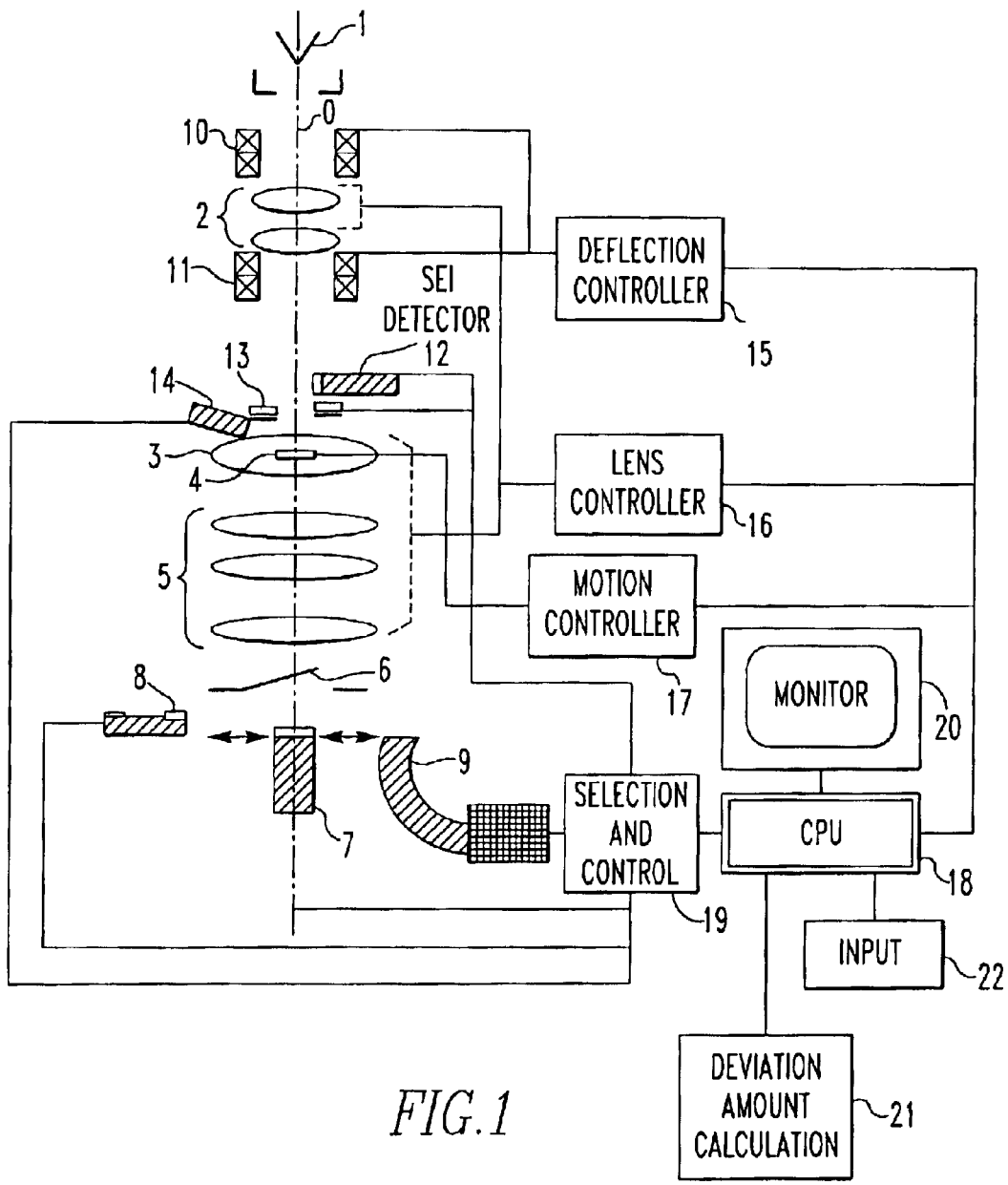
FIG. 1 is a diagram of a transmission electron microscope for carrying out an analytical method according to the present invention.

Referring to FIG. 1, there is shown a scanning transmission electron microscope for carrying out an analytical method according to the present invention. This microscope has an electron gun 1 emitting an electron beam that is directed along an optical axis 0 at a specimen on a specimen stage 4 after being well collimated by a system of condenser lenses 2. Electrons transmitted through the specimen 4 and scattered electrons are focused onto a fluorescent screen 6 by an objective lens 3 and imaging lenses 5.

The fluorescent screen 6 can be opened and closed. When the fluorescent screen 6 is placed horizontal (closed), a TEM image can be observed on the fluorescent screen. When the fluorescent screen 6 is placed vertical (opened), electrons pass across the position of the fluorescent screen 6 and are guided below it. A television camera tube 7 for picking up a TV image, an STEM (scanning transmission electron microscopy) detector 8, and an electron energy loss spectroscopy (EELS) spectrometer 9 are selectively placed on the optical axis 0 under the fluorescent screen 6.

Deflection coils 10 and 11 are placed in the top and bottom stages, respectively, of the system of condenser lenses 2. An SEI (secondary electron image) detector 12, a BEI (backscattered electron image) detector 13, an EDS (energy-dispersive) X-ray detector 14, etc. are placed above the specimen 4.

The deflection coils 10 and 11 are controlled by a deflection controller 15. The system of condenser lenses 2, objective lens 3, and imaging lenses 5 are controlled by a lens controller 16. The position of the specimen and specimen stage 4 is controlled by a specimen motion controller 17. The deflection controller 15, lens controller 16, and specimen motion controller 17 are controlled by a CPU 18.

Output signals from the SEI detector 12, BEI detector 13, EDS detector 14, television camera tube 7, STEM detector 8, and EELS spectrometer 9 are supplied to a signal selection-and-control portion 19, which, in turn, selects one out of these output signals. The signal selected by the signal selection-and-control portion 19 is fed to the CPU 18. This CPU 18 supplies the incoming signal to a monitor 20. As a result, various images and spectra are displayed on the monitor 20.

The image signal supplied from the signal selection-and-control portion 19 is sent by the CPU 18 to a deviation amount calculation means 21 that calculates the amount of deviation between images as described later. An input device 22, for example, keyboard, keypad and/or mouse is connected with the CPU 18 to permit a user to make settings of analysis points within the image displayed on the monitor 20. The operation of the apparatus constructed in this way is next described.

In TEM imaging mode, the lens strengths of the system of condenser lenses 2, objective lens 3, and imaging lenses 5 are controlled by the lens controller 16. A sharply focused electron beam is directed at the specimen 4. The position on the specimen hit by the electron beam is determined by moving the specimen 4 horizontally under control of the specimen motion controller 17.

A part of the electron beam hitting the specimen is transmitted through the specimen 4, while the other electrons are backscattered by the specimen 4. The transmitted and backscattered electrons are focused by the imaging lenses 5 including the objective lens 3. A TEM image of the specimen 4 is projected onto the fluorescent screen 6. Consequently, the fluorescent screen 6 enables the user to observe the TEM image.

At this time, the fluorescent screen 6 is opened. The television camera tube 7 is placed on the optical axis under the fluorescent screen 6. The TEM image is converted into a TV signal by the television camera tube 7. The TEM image on the monitor 20 can be observed by controlling the signal selection-and-control portion 19 to select the TV signal from the television camera tube 7 and sending this TV signal to the monitor 20 via the CPU 18.

In scanning secondary electron imaging mode, the lens strengths of the system of condenser lenses 2 and objective lens 3 are controlled by the lens controller 16. A sharply focused electron beam is directed at the specimen 4. Scan signals for scanning the electron beam are supplied to the deflection coils 10 and 11 by the deflection controller 15. As a result, a desired area on the specimen is scanned by the sharply focused electron beam.

As the specimen is scanned with the electron beam in this way, secondary electrons and other electrons are produced from the specimen 4. The secondary electrons are detected by the SEI detector 12. The output signal from this detector 12 is supplied as a brightness-modulating signal to the monitor 20 via the signal selection-and-control portion 19 and CPU 18. In consequence, a secondary electron image of the desired area on the specimen is displayed on the monitor 20.

In scanning backscattered electron imaging mode, the lens strengths of the system of condenser lenses 2 and objective lens 3 are controlled by the lens controller 16. A sharply focused electron beam is directed at the specimen 4. Scan signals for scanning the electron beam are supplied to the deflection coils 10 and 11 by the deflection controller 15. As a result, the desired area on the specimen is scanned by the sharply focused electron beam.

Backscattered electrons produced from the specimen 4 when the specimen is scanned with the electron beam are detected by the BEI detector 13. The output signal from the BEI detector 13 is supplied as a brightness-modulating signal to the monitor 20 via the signal selection-and-control portion 19 and CPU 18. The result is that a BEI image of the desired area on the specimen is displayed on the monitor 20.

In scanning transmission electron microscopy (STEM) imaging mode, the lens strengths of the system of condenser lenses 2 and objective lens 3 are controlled by the lens controller 16. A sharply focused electron beam is directed at the specimen 4. Scan signals for scanning the electron beam are supplied to the deflection coils 10 and 11 by the deflection controller 15. Consequently, the desired area on the specimen is scanned with the sharply focused electron beam. The fluorescent screen 6 is opened. The STEM detector 8 is placed on the optical axis.

As the specimen is scanned with the electron beam, some electrons are transmitted through the specimen 4. Other electrons are backscattered. These electrons are detected by the STEM detector 8. The output signal from the STEM detector 8 is supplied as a brightness-modulating signal to the monitor 20 via the signal selection-and-control portion 19 and CPU 18. As a result, a scanning transmission electron image of the desired area on the specimen is displayed on the monitor 20.

When an X-ray analysis of a certain point on the specimen 4 is performed, the lens strengths of the system of condenser lenses 2 and objective lens 3 are controlled by the lens controller 16. A sharply focused electron beam is directed at the certain analysis point on the specimen 4. This gives rise to characteristic X-rays from the analysis point on the specimen. The characteristic X-rays are detected by the EDS detector 14. The output signal from the EDS detector 14 is supplied to the CPU 18 via the signal selection-and-control portion 19. The CPU 18 performs an X-ray analysis of the certain analysis point on the specimen 4 in terms of the peak values of the output signal from the detector.

In X-ray mapping mode based on certain characteristic X-rays, the lens strengths of the system of condenser lenses 2 and objective lens 3 are controlled by the lens controller 16. A sharply focused electron beam is directed at the specimen 4. Scan signals for scanning the electron beam are supplied to the deflection coils 10 and 11 by the deflection controller 15. As a result, the desired area on the specimen is scanned with the sharply focused electron beam.

Characteristic X-rays emanating from the specimen 4 during the scanning are detected by the EDS detector 14. The output signal from the EDS detector 14 is supplied to the CPU 18 via the signal selection-and-control portion 19. Only those of the pulse signals supplied to the CPU 18 which have a certain peak value are selected and supplied as a brightness-modulating signal to the monitor 20. As a result, an X-ray mapping image based on the certain characteristic X-rays from the desired area on the specimen is displayed on the monitor 20.

When electron energy loss spectroscopy (EELS) is performed, the lens strengths of the system of condenser lenses 2 and objective lens 3 are controlled by the lens controller 16. A sharply focused electron beam is directed at the analysis point on the specimen 4. The EELS spectrometer 9 is placed on the optical axis under the fluorescent screen 6. Under this condition, the energy distribution of transmitted electrons and scattering electrons is obtained by the EELS spectrometer 9. A signal indicating the energy spectrum obtained by the spectrometer 9 is supplied to the CPU 18 via the signal selection-and-control portion 19. The spectrum is displayed on the monitor 20.

Figure 2:
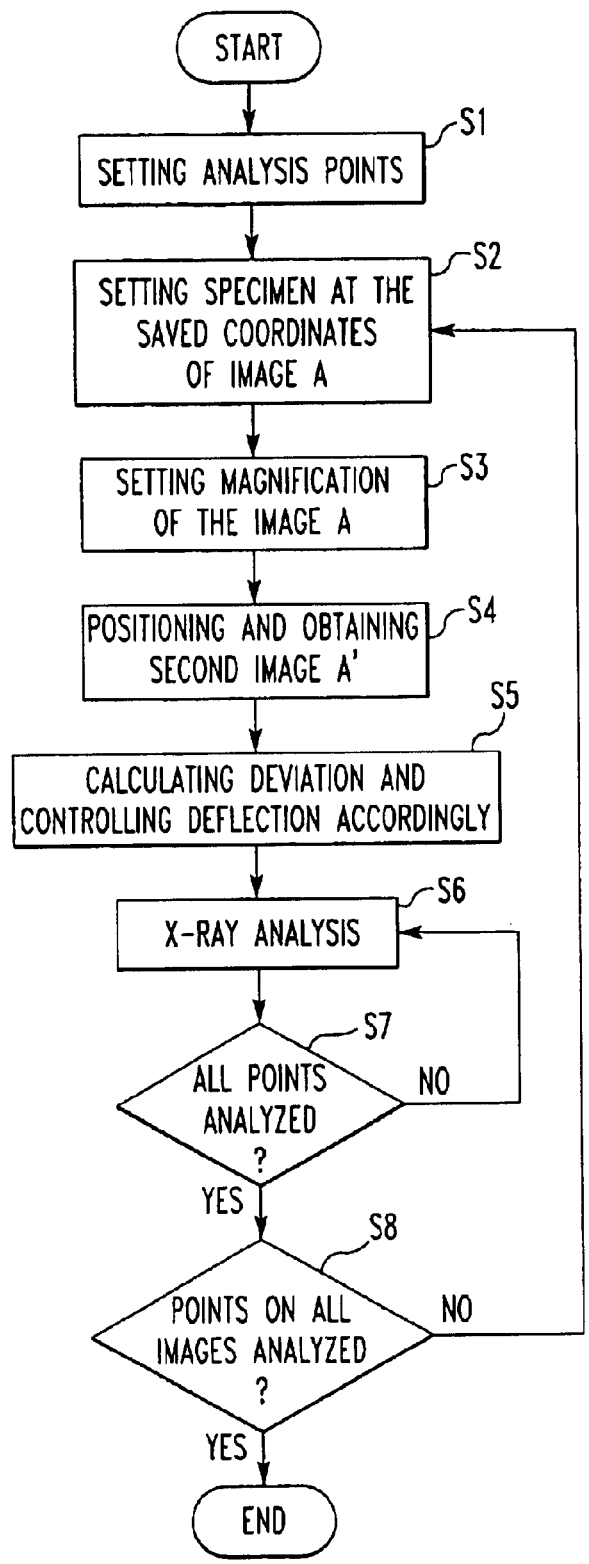
FIG. 2 is a flowchart illustrating a first embodiment of the analytical method according to the present invention.

A method of performing X-ray analyses of plural analysis points on the specimen is now described by referring to the flowchart of FIG. 2. First, a scanning secondary electron image is obtained to set the analysis points. As the specimen is scanned with the electron beam, secondary electrons are emitted from the specimen 4. The secondary electrons are detected by the SEI detector 12. The output signal from the detector 12 is supplied to the monitor 20 as a brightness-modulating signal via the signal selection-and-control portion 19 and CPU 18. As a result, a scanning secondary electron image of the desired area on the specimen is displayed on the monitor 20. A human operator appropriately moves the specimen 4 by operating the input means to control the specimen motion controller while observing the image displayed on the monitor 20.

When a desired image A (herein referred to as the first image) containing the analysis points or analyzed area is obtained and displayed on the monitor 20, movement of the specimen is stopped. If the operator issues instructions to save data, the position of the stage (corresponding to the position of the specimen) on which the specimen 4 is carried is stored in the CPU 18. The obtained image itself is stored as a reference image A in a memory within the CPU 18 together with data about the magnification.

The image stored in the CPU 18 is displayed on the monitor 20. The operator operates the input device 22 while observing the image displayed on the monitor 20. In this way, plural analysis points (analysis positions) are set (selected) within the image. For example, where N analysis points are set, the coordinates of the positions of the analysis points within the image are stored in the CPU 18.

After setting the analysis points on one image displayed on the monitor 20, the specimen 4 is again moved. An image B of the next desired area on the specimen is displayed on the monitor 20. If the operator issues instructions to save data about this image B and sets analysis points, the reference image B, the position of the specimen (stage position), and data about the magnification are stored in the CPU 18. Also, the coordinates of the positions of the analysis points within the image B are stored (step S1).

After the reference images are stored and the analysis points on the reference images are set in this manner, X-ray analyses of the set analysis points are carried out. First, the CPU 18 sets the specimen motion controller 17 at the coordinates of the stage assumed when the image A was gained (step S2). The CPU 18 also sets the lens controller 16 at the magnification of the image A (step S3). As a result, the stage is moved into the position where the image A was gained. The magnification of the image is set equal to the magnification used when the image A was obtained.

After completion of the setting of the stage position and magnification, a second image is gained under these conditions. At this time, the obtained image does not completely agree with the image A due to the accuracy of movement of the stage but is a slightly different image A'. The stored reference image A and the newly obtained image A' are supplied to the deviation amount calculation means 21 (step S4).

The deviation amount calculation means 21 compares these two supplied images and finds the amount of deviation of the position of the newly obtained image from the position of the reference image. For this purpose, the correlation between the two images is found using fast-Fourier transform technology. Alternatively, a position where the difference between the intensity of the signal indicating the image A and the intensity of the signal indicating the image A' is minimal may be calculated.

The amount of deviation found in this way is supplied to the CPU 18. The CPU 18 controls the deflection controller 15 such that the sharply focused electron beam hits the analysis points contained in the image A. Data about the coordinates of the analysis points is stored in the CPU 18. The coordinates of each analysis point are corrected by an amount corresponding to the amount of deviation. As a result, if the specimen position deviates due to the accuracy of the position of the stage, the electron beam is precisely directed at the preset analysis points (step S5).

When the electron beam is directed at each analysis point, characteristic X-rays are emitted from the analysis point and detected by the EDS detector 14, and an X-ray analysis is performed (step S6). After completing X-ray analyses of the plural analysis points within the image A (step S7), X-ray analyses of the analysis points in the next image B are carried out. In the X-ray analyses of this image, the amount of deviation between the newly gained image and the reference image is found in the same way as in the analyses on the image A. The deflection position of the electron beam is corrected based on the amount of deviation. Consequently, the beam is precisely directed at the set analysis points, and analyses are performed.

In this way, with respect to N reference images, the specimen stage is moved based on the coordinates of the stage. The magnification is taken as a set value. The amount of deviation between a newly gained image and a reference image is found. The deflection position of the electron beam is corrected based on the amount of deviation. Consequently, X-ray analyses of multiple analysis points can be performed automatically and accurately (step S8). In this embodiment, characteristic X-rays emanating from each analysis point are detected by the EDS detector 14, and X-ray analyses are performed. Alternatively, EELS analyses of electrons transmitted through each analysis point may be performed. In the embodiment above, a scanning secondary electron image is used as a reference image, and a new scanning secondary electron image is taken in performing an analysis. Alternatively, scanning backscattered electron images or STEM images may be used.

Figure 3:
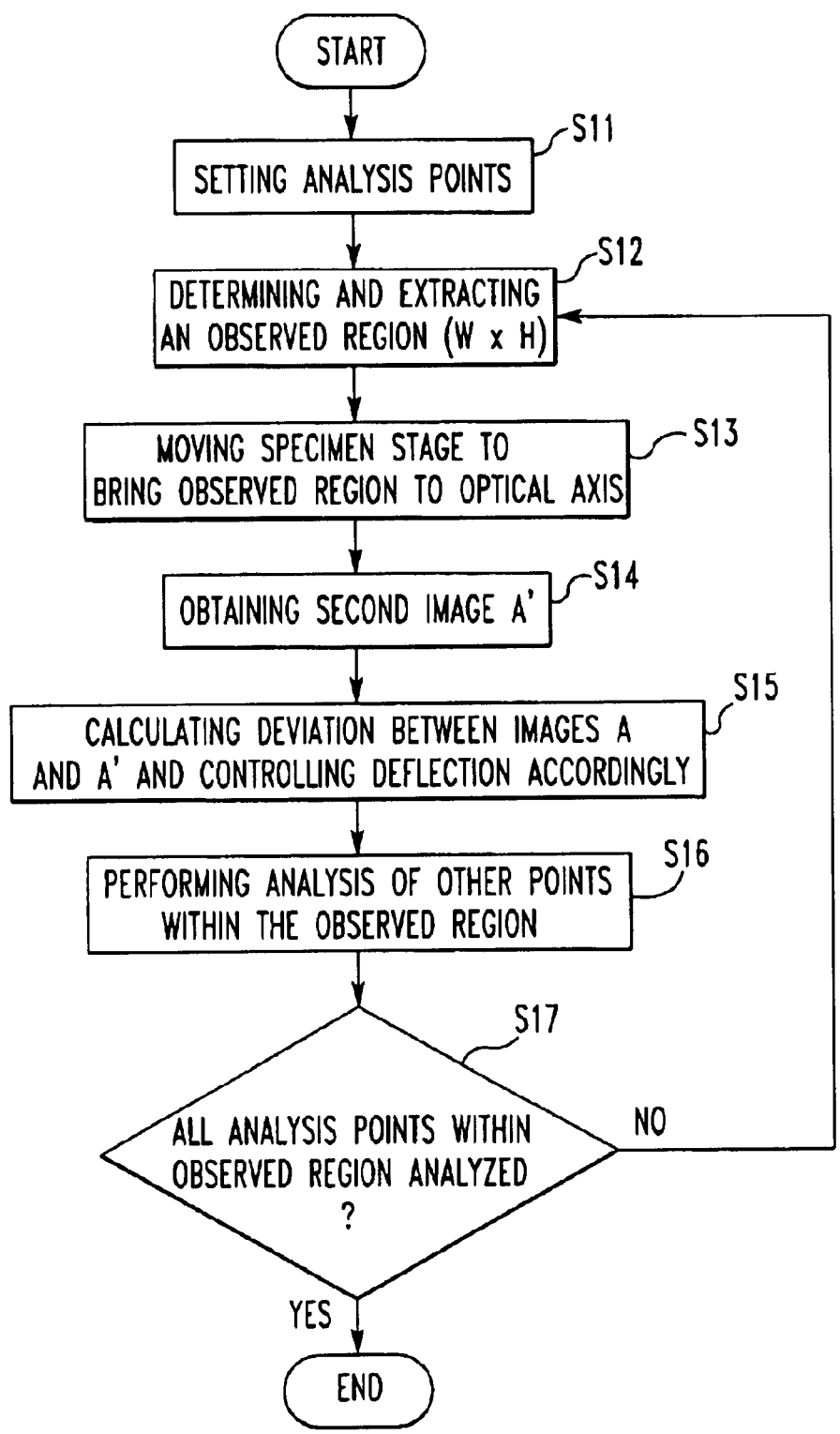
FIG. 3 is a flowchart illustrating a second embodiment of the analytical method according to the present invention.
Figure 4:
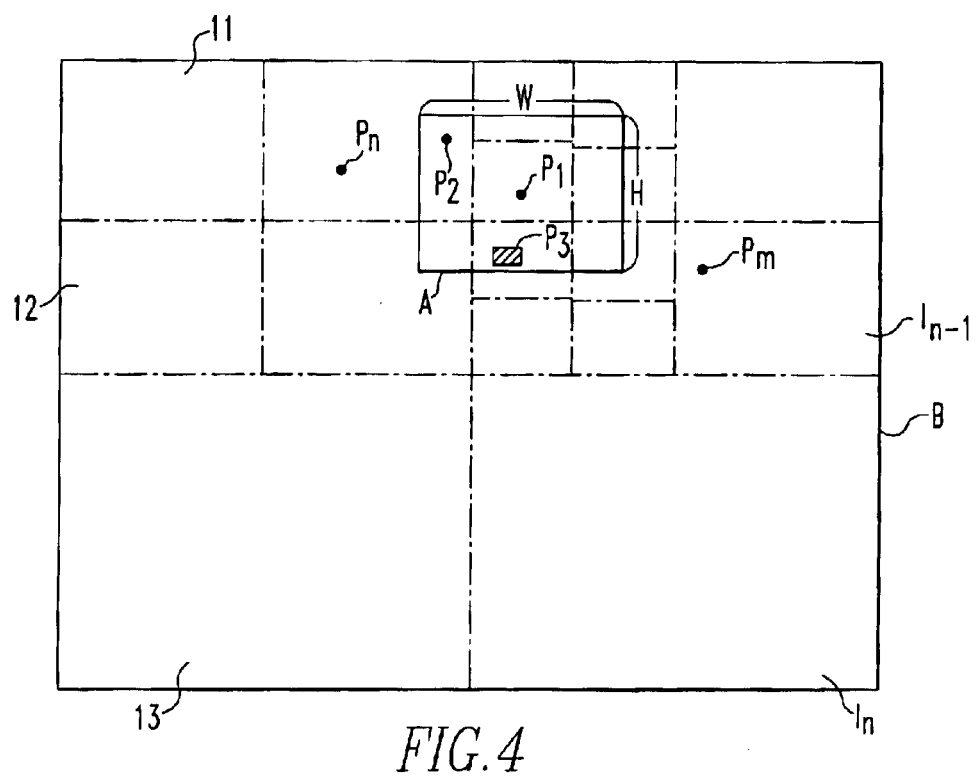
FIG. 4 is a diagram showing a synthesized image.

Another embodiment of the present invention is next described by referring to the flowchart of FIG. 3. In this embodiment, plural images $I_1$ to $I_n$ (herein referred to as the first images) (e.g., scanning secondary electron images) are obtained from the same specimen at different specimen positions and at different magnifications. These images are placed in positions corresponding to their positional relations, and a synthesized image of the specimen is created by the CPU 18. The created image is stored in the memory within the CPU 18. FIG. 4 shows this synthesized image. That is, a synthesized image B is created from the images $I_1$ to $I_n$.

This synthesized image B is displayed on the monitor 20. Analysis points $P_1$ to $P_n$ where X-ray analyses are performed are set (step S11). Where the analysis point $P_1$ is analyzed, a given magnification at which the analysis is performed in practice is set to M. Once the magnification M is set, an observed region (W×H) is determined. An area of the image B which corresponds to the observed region (W×H) containing the analysis point or area $P_1$ is extracted and taken as the reference image A. This reference image is stored in the memory within the CPU 18 (step S12).

Then, the specimen motion controller 17 is controlled to move the specimen stage such that the observed region comes on the center of the optical axis (step S13). Thereafter, an image A' that is a second image (scanning secondary electron image) is obtained at magnification M by electron beam scanning (step S14). The reference image A stored in the CPU 18 and the obtained image A' are supplied to the deviation amount calculation means 21 and compared. The amount of deviation between both observed regions (W×H) is calculated. The calculated amount of deviation is supplied via the CPU 18 to the deflection controller 15. The electron beam is deflected according to the amount of deviation. The beam is controlled to hit the analysis point precisely. As a result of the processing described thus far, if specimen movement involves error, the electron beam is prevented from hitting a deviated specimen position (step S15).

After completion of an analysis of the analysis point $P_1$, an analysis of other analysis point or area within the reference image A (or obtained image A') is automatically carried out (step S16). If there remain any analysis points ($P_n$ to $P_m$) to be analyzed at this time, the specimen-moving stage is moved to bring these analysis points or area to within the observed region (W×H). The above-described process is repeated. In this way, every analysis point or area is analyzed. Since it is considered that an area to be analyzed does not enter the observed region (W×H) determined by the magnification M, the magnification may be varied according to the analyzed area such that this analyzed area comes within the observed region (W×H) (step S17).

Note that the observed region (W×H) is limited by the minimum magnification of the instrument. In this way, this embodiment has the advantage that an area to be analyzed can be set beyond the boundary of the previously obtained image, unlike the first embodiment where such setting cannot be made.

After the end of the analysis of the analysis point $P_1$, an analysis of the analysis point $P_2$ is performed similarly. In the analytical method described thus far, each analysis point is placed at the center of the image, i.e., on the optical axis. In practice, each analysis point does not need to be placed at the center. It is considered that the set analysis area does not lie within the observed region at the magnification M. Therefore, the magnification M may be varied for each analysis point or area such that the analyzed area comes within the observed region. In this way, this embodiment has the advantage that an analysis point or area can be set beyond the boundary of the already obtained image, unlike the first embodiment.

As described thus far, the analytical method according to the present invention is applied to electron microscopy and starts with letting the user set plural analysis points on a reference image. When an analysis of each analysis point is performed, an image corresponding to the reference image is gained. The two images are compared. The amount of deviation between them is calculated. The electron beam directed at the analysis point is deflected based on the calculated amount of deviation. In this way, the position hit by the electron beam is corrected. As a result, analyses of the set analysis points can be carried out automatically and precisely.

Having thus described our invention with the detail and particularity required by the Patent Laws, what is desired protected by Letters Patent is set forth in the following claims.

What is claimed is:

1. An analytical method for analyzing a selected analysis point on a specimen with an electron beam directed at the analysis point, said selected analysis point within an image of the specimen comprising the steps of:

obtaining a first image of a specimen fixed to a specimen stage as a reference image when the specimen is in a first position of the specimen stage;

storing said reference image and said first position of the specimen as determined by the position of the specimen stage in memory;

specifying an analysis point within said reference image;

storing coordinates of the specified analysis point in memory;

returning said specimen into a returned position according to the stored position of the specimen;

obtaining a second image in said returned position;

comparing said returned image with said reference image and calculating the amount of deviation in position between both images; and correcting the amount of deflection of the electron beam based on the calculated amount of deviation between the images and shining the beam at the analysis point to thereby perform an analysis of the analysis point.

2. The analytical method of claim 1, wherein said step of obtaining the first image of the specimen as the reference image involves storing magnification of said reference image in memory, and wherein said step of storing the returned image in memory involves obtaining the returned image at the stored magnification.

3. The analytical method of claim 1, wherein said first and returned images are scanning transmission electron microscope images.

4. The analytical method of claim 1, wherein said first and returned images are scanning electron microscope images.

5. The analytical method of claim 1, wherein said step of performing an analysis of the analysis point consists of detecting characteristic X-rays emanating from the analysis point illuminated with the electron beam and performing an X-ray analysis using the detected X-rays.

6. The analytical method of claim 1, wherein, (A) said step of obtaining the first image of the specimen as the reference image involves obtaining first different images as reference images in succession;

(B) said step of obtaining the first image of the specimen as the reference image involves storing said reference images and positions of the specimen assumed when said reference images were respectively obtained in memory; and (C) said step of storing the reference image and said position of the specimen in memory involves specifying analysis positions within each reference image and storing coordinates of the specified analysis positions in memory.

7. An analytical method for analyzing a selected point on a specimen with an electron beam directed at the analysis point, said selected point within a synthesized image of said specimen comprising the steps of:

obtaining plural first images of a specimen;

combining said first images into a synthesized image;

setting an analysis point in said synthesized image;

extracting an area of a given magnification including the analysis point to create a reference image;

obtaining a second image of the area including the analysis point at the given magnification;

comparing said second image with said reference image and calculating the amount of deviation in position between both images; and correcting the amount of deflection of the electron beam based on the calculated amount of deviation between the images and directing the beam at said analysis point to thereby perform an analysis of said analysis point on the specimen.

8. The analytical method of claim 7, wherein said step of obtaining said second image of the area involves bringing said analysis point to center of said second image.

* * * * *